(12) United States Patent
Shekhar et al.

(10) Patent No.: US 12,057,433 B2
(45) Date of Patent: Aug. 6, 2024

(54) EM AND RF MITIGATION SILICON STRUCTURES IN STACKED DIE MICROPROCESSORS FOR DIE TO PLATFORM AND DIE-DIE RF NOISE SUPPRESSION

(71) Applicant: Intel Corporation, Santa Clara, CA (US)

(72) Inventors: Sameer Shekhar, Portland, OR (US); Amit Jain, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 16/910,014

(22) Filed: Jun. 23, 2020

(65) Prior Publication Data

US 2021/0398944 A1 Dec. 23, 2021

(51) Int. Cl.
| | | |
|---|---|---|
| *H01L 25/065* | (2023.01) | |
| *H01L 23/427* | (2006.01) | |
| *H01L 23/552* | (2006.01) | |
| *H01L 49/02* | (2006.01) | |
| *H03H 1/00* | (2006.01) | |
| *H03H 7/01* | (2006.01) | |

(52) U.S. Cl.
CPC ........ *H01L 25/0652* (2013.01); *H01L 23/427* (2013.01); *H01L 23/552* (2013.01); *H01L 28/10* (2013.01); *H01L 28/60* (2013.01); *H03H 1/0007* (2013.01); *H03H 7/0115* (2013.01); *H01L 2225/06513* (2013.01); *H01L 2225/06537* (2013.01); *H01L 2225/06544* (2013.01); *H01L 2225/06589* (2013.01); *H03H 2001/0078* (2013.01)

(58) Field of Classification Search
CPC ... H01L 25/0652; H01L 23/552; H01L 28/10; H01L 28/60; H01L 2225/06513; H01L 2225/06537; H01L 2225/06544; H03H 1/0007; H03H 7/0115; H03H 2001/0078
See application file for complete search history.

(56) References Cited

U.S. PATENT DOCUMENTS

| | | | |
|---|---|---|---|
| 9,099,999 B1 * | 8/2015 | Wang | H03K 17/00 |
| 2019/0200454 A1 * | 6/2019 | Liu | H03H 7/0115 |

* cited by examiner

*Primary Examiner* — Samuel A Gebremariam
(74) *Attorney, Agent, or Firm* — Schwabe, Williamson & Wyatt P.C.

(57) ABSTRACT

Embodiments disclosed herein include electronic packages and their components. In an embodiment, an electronic package comprises a package substrate and a base die over the package substrate. In an embodiment, the electronic package further comprises a plurality of chiplets over the base die. In an embodiment, the base die comprises a substrate, a first metal layer and a second metal layer between the substrate and the plurality of chiplets, and a third metal layer and a fourth metal layer between the package substrate and the substrate. In an embodiment, a filter is integrated into one or more layers of the base die.

26 Claims, 10 Drawing Sheets

US 12,057,433 B2

EM AND RF MITIGATION SILICON STRUCTURES IN STACKED DIE MICROPROCESSORS FOR DIE TO PLATFORM AND DIE-DIE RF NOISE SUPPRESSION

TECHNICAL FIELD

Embodiments of the present disclosure relate to semiconductor devices, and more particularly to electronic packages with stacked dies and noise suppression features in a base die.

BACKGROUND

Multi-chip packaging is becoming more common in electronic products. The packaging of various dies with switching capability in near proximity with each other has the potential to cause significant RF noise issues due to switching of IO buffers and/or integrated voltage regulators FETs in close proximity. Additionally, traditional RFI mitigation techniques, such as RF capacitors, are not easy to integrate into packages due to required height constraints. Alternative solutions, such as discrete RF shielding, are expensive to implement, and are not attractive solutions for high volume manufacturing.

The RF noise can lead to several issues in the electronic system. One such issue is that wireless communication throughput (e.g., Wi-Fi bandwidth) is reduced. Interference may also cause issues between the chiplets in the package, as well as interference of electronics on other neighboring electronic packages.

EMBODIMENTS OF THE PRESENT DISCLOSURE

Described herein are electronic packages with stacked dies and noise suppression features in a base die, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
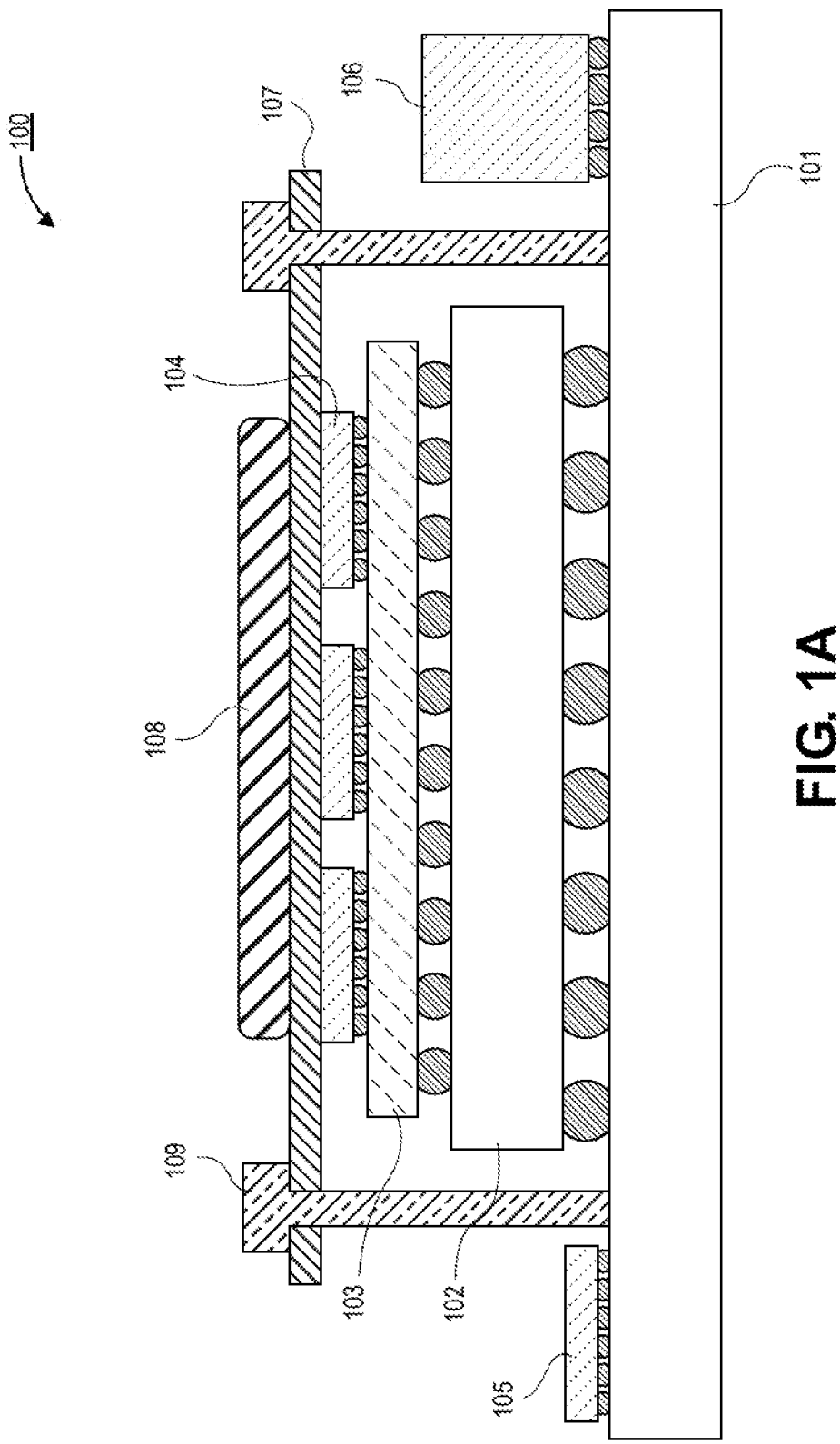
FIG. 1A is a cross-sectional illustration of an electronic system with multiple chiplets over a base die, in accordance with an embodiment.

As noted above, the drive to integrate more chiplets within a single package results in an increase in RF interference. The RF interference has the potential to negatively impact the chiplets in the package as well as the functioning of other components proximate to the electronic package. Particularly, the increased RF interference has the potential to reduce throughput of wireless (e.g., Wi-Fi) communications to and from the system. The issue of interference will become an even greater issue as wireless communications move towards higher frequencies (e.g., with moves to Wi-Fi 6/7 and 5G communication protocols). FIG. 1A is a cross-sectional illustration of one such electronic system 100 that may be susceptible to RF interferences.

The electronic system 100 may comprise a board 101 and a package substrate 102 attached to the board 101. The board may be a motherboard or the like. The package substrate 102 may comprise conductive routing (not shown) that is sandwiched between insulating layers. In some embodiments, the package substrate 102 may be cored, while in other embodiments, the package substrate 102 may be coreless.

In an embodiment, a base substrate 103 is disposed over the package substrate 102. In an embodiment, the base substrate 103 comprises silicon, though other embodiments may use alternative materials that allow for high density routing (e.g., glass). In some embodiments, the base substrate 103 is a passive substrate or an active substrate. A passive substrate may include only conductive routing and passive electrical components (e.g., capacitors, inductors, resistors, etc.). In an active base substrate 103, the base substrate 103 may also comprise transistor devices or other switching components. The base substrate 103 may sometimes be referred to as an interposer.

In an embodiment, the base substrate 103 provides high density routing (not shown) between chiplets 104 attached over the base substrate 103. The chiplets 104 (also sometimes referred to as dies) may supply various functionalities to the electronic system 100. For example, the chiplets 104 may comprise a central processing unit (CPU), a graphics processor, a system on chip (SoC), memory, and the like. A dedicated memory device 106 (e.g., a high bandwidth memory (HBM)) and a communication chip 105 (e.g., an antenna and transceiver) may also be included in the electronic system 100. The memory device 106 and the communication chip 105 may be electrically coupled to one or more of the chiplets 104 through the board 101, the package substrate 102, and the base substrate 103. In an embodiment, a thermal solution (e.g., cold plate 107 and heat pipe 108) may be used to control a temperature of the chiplets 104. The thermal solution may be attached to the board 101 or package substrate 102 by a fastener 109 or the like.

As noted above discrete RF interference mitigation solutions are costly and/or do not conform to the form factor available in advanced electronic systems. Accordingly, embodiments disclosed herein provide RF filtering solutions on the base substrate. Such RF filtering can be used to reduce RF interference and provide enhanced performance for the electronic system 100, such as improved wireless throughputs.

Figure 1B:
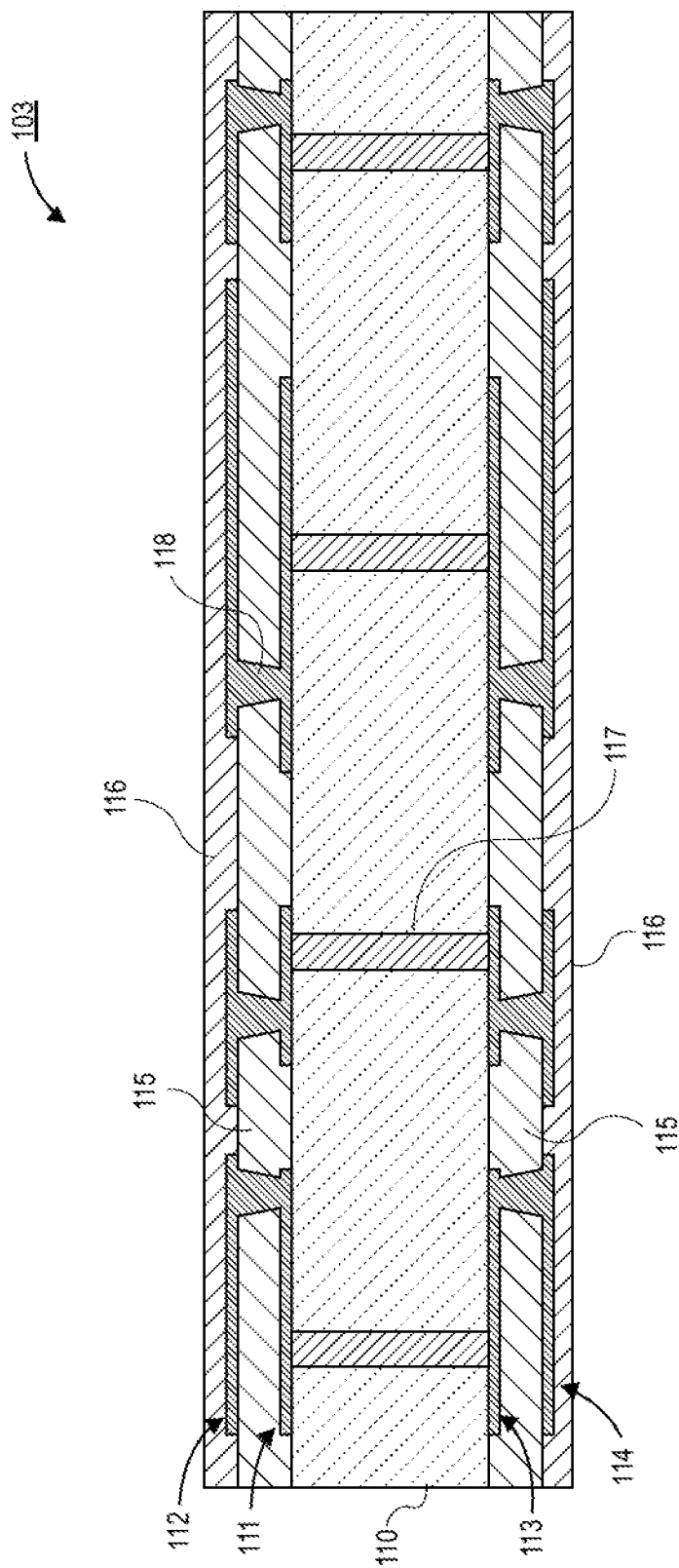
FIG. 1B is a cross-sectional illustration of the base die in FIG. 1A, in accordance with an embodiment.

Referring now to FIG. 1B, a cross-sectional illustration of a base substrate 103 is shown, in accordance with an embodiment. The base substrate 103 is simplified for illustrative purposes. Particularly, different metal layers and through substrate vias (TSVs) that may be used to implement various filtering applications are shown. However, it is to be appreciated that the filters described in greater detail below are absent from the base substrate 103 in FIG. 1B.

In an embodiment, the base substrate 103 may comprise a substrate 110. The substrate 110 may be a silicon substrate. TSVs 117 may pass through a thickness of the substrate 110 in order to provide electrical connections between opposing surfaces of the base substrate 103. In an embodiment, a first metal layer 111 and a second metal layer 112 may be disposed over a top surface of the substrate 110, and a third metal layer 113, and a fourth metal layer 114 may be disposed over a bottom surface of the substrate 110. While pairs of metal layers are shown over the top and bottom surfaces, it is to be appreciated that embodiments may include one or more metal layers over each surface of the substrate 110. In an embodiment, metal layers on the same side of the substrate 110 (e.g., the first metal layer 111 and the second metal layer 112) may be electrically coupled to each other by vias 118 that pass through an insulating layer 115. In some embodiments, a solder resist layer 116 or the like may be disposed over the topmost metal layer (e.g. the second metal layer 112) and the bottommost metal layer (e.g., the fourth metal layer 114).

Figure 2A:
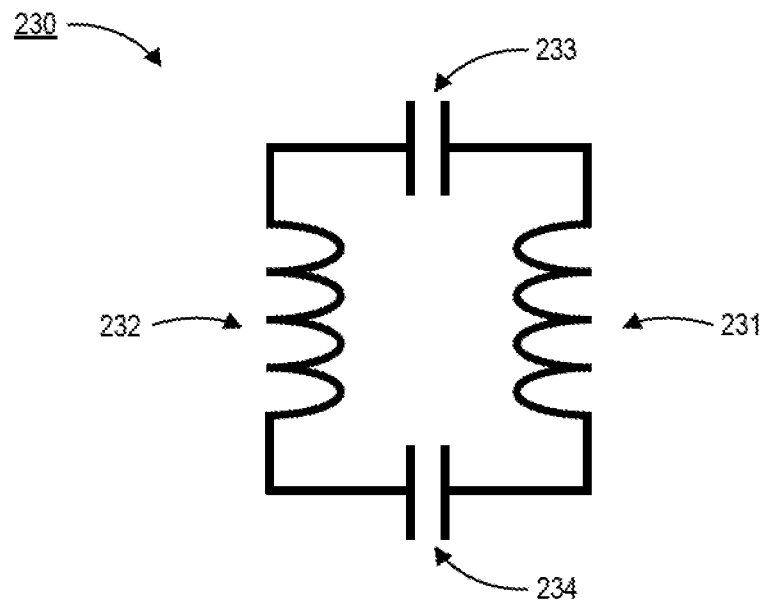
FIG. 2A is schematic of a common mode choke filter that may be implemented on the base die, in accordance with an embodiment.

Referring now to FIG. 2A, a schematic of an electrical circuit 230 that may be implemented in the base substrate 103 is shown, in accordance with an embodiment. The electrical circuit 230 shown in FIG. 2A is a common mode choke filter. The electrical circuit comprises a first capacitor 233 and a second capacitor 234. A first inductor 231 and a second inductor 232 are provided between the two capacitors 233 and 234. The first inductor 231 and the second inductor 232 may be strongly coupled to each other.

Figure 2B:
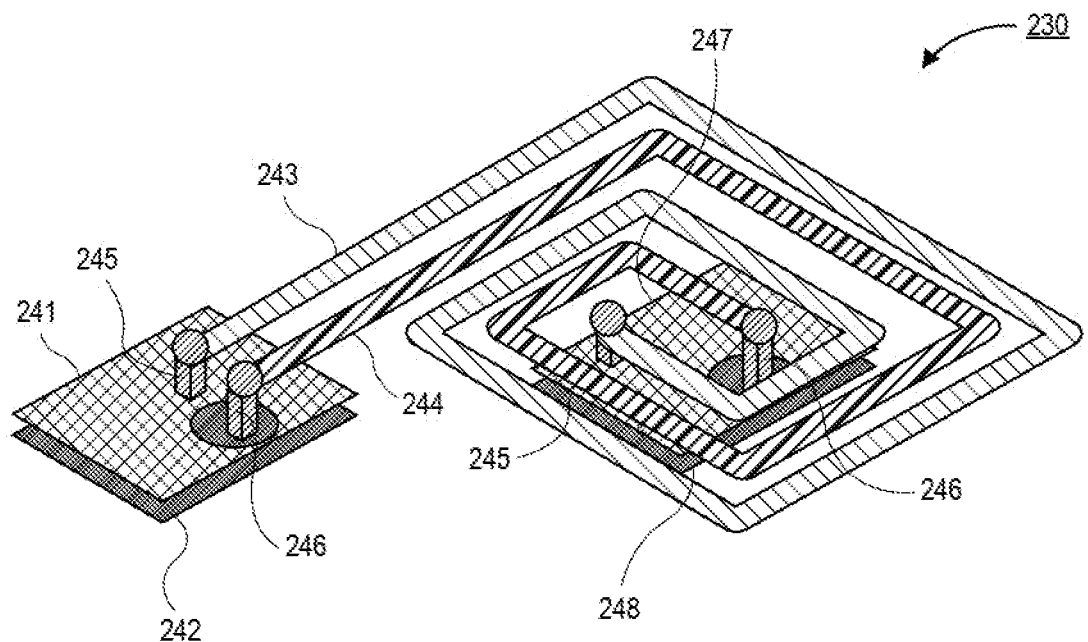
FIG. 2B is an illustration of a common mode choke filter implementation on a base die, in accordance with an embodiment.

Referring now to FIG. 2B, an illustration of an implementation of the common mode choke filter 230 that can be implemented in a base substrate 103 is shown, in accordance with an embodiment. In the illustrated embodiment, only the components of the circuit are shown. That is, the layers of the base substrate 103 in which the common mode choke filter 230 are formed are omitted for clarity.

In an embodiment, the first capacitor 233 and the second capacitor 234 are implemented with a pair of parallel plates (i.e., plates 241 and 242 form the first capacitor 233, and plates 247 and 248 form a second capacitor 234). The parallel plates 241/242 and 247/248 may be implemented as metal-insulator-metal (MIM) capacitors. In an embodiment, the MIM capacitors are formed between a first metal layer and a second metal layer (i.e., the first metal layer 111 and the second metal layer 112 in FIG. 1B). In an embodiment, a connection to the bottom metal plates (i.e., plates 242 and 248) may be made through openings in the top metal plates (i.e., plates 241 and 247).

In an embodiment, the plates 241/242 and 247/248 may be electrically connected to a first inductor 231 and a second inductor 232. In an embodiment, a first inductor 231 is implemented as a first spiral trace 243 and a second inductor 232 is implemented as a second spiral trace 244. In an embodiment, the first inductor 231 and the second inductor 232 are provided in the second metal layer (i.e., the second metal layer 112 in FIG. 1B). The plates 241/242 and 247/248 may be connected to the spiral traces 243/244 by vias 245/246. In a particular embodiment, the first spiral trace 243 is connected to plates 241 and 247, and the second spiral trace 244 is connected to plates 242 and 248. The first spiral trace 243 and the second spiral trace 244 are interwoven in order to prove strong coupling between the first inductor 231 and the second inductor 232.

While described as being positioned in the first metal layer 111 and the second metal layer 112, it is to be appreciated that the common mode choke filter 230 may be implemented in any of the metal layers of the base substrate 103. Additionally, while the plates 241/242 and 247/248 are illustrated as being below the spiral traces 243/244, it is to be appreciated that in some embodiments, the spiral traces 243/244 may be below the plates 241/242 and 247/248.

Figure 2C:
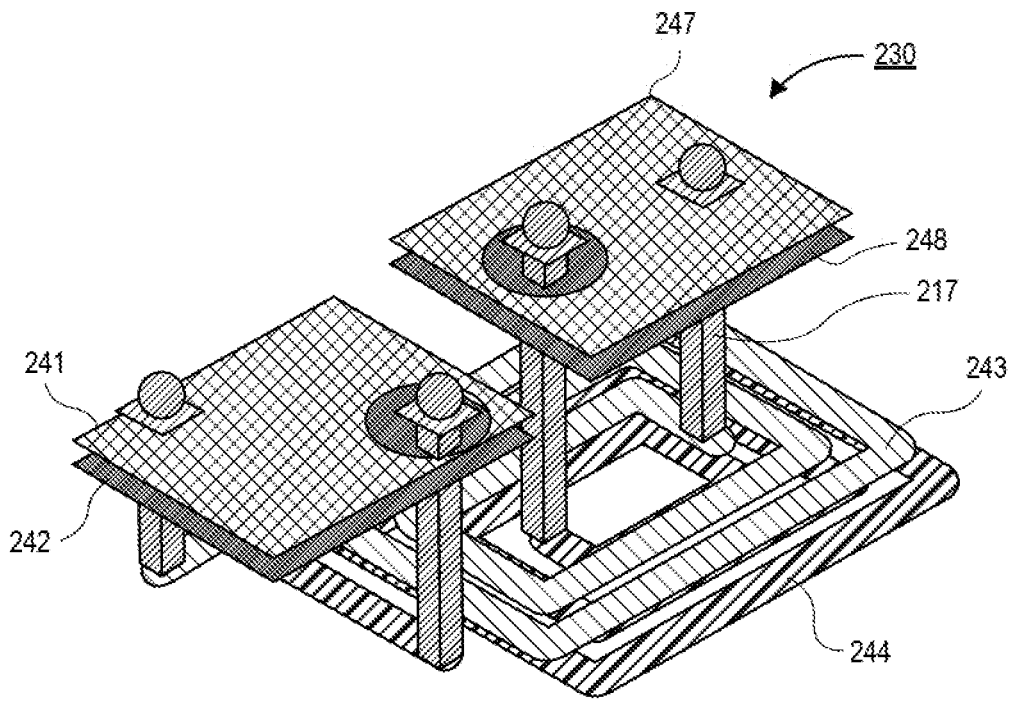
FIG. 2C is an illustration of a common mode choke filter implementation on a base die, in accordance with an additional embodiment.

Referring now to FIG. 2C, an illustration of an additional implementation of the common mode choke filter 230 is shown, in accordance with an embodiment. In the illustrated embodiment, only the components of the circuit are shown. That is, the layers of the base substrate 103 in which the common mode choke filter 230 are formed are omitted for clarity.

As shown, the first capacitor 233 (i.e., plates 241 and 242) and the second capacitor 234 (i.e., plates 247 and 248) are connected to the first inductor 231 (i.e., first spiral trace 243) and the second inductor 232 (i.e., second spiral trace 244) by TSVs 217. Particularly, the first spiral trace 243 is connected between plate 241 and plate 247, and the second spiral trace 244 is connected between plate 242 and plate 248. The use of TSVs 217 allow for the first capacitor 233 and the second capacitor 234 to be disposed over a first surface of the base substrate 103 and the first inductor 231 and second inductor 232 to be disposed over a second surface of the base substrate 103. That is, the capacitors 233/234 and the inductors 231/232 are on an opposite sides of the base substrate 103.

In the illustrated embodiment, the first spiral trace 243 is shown as being on a different metal layer than the second spiral trace 244. However, in other embodiments, the first spiral trace 243 and the second spiral trace 244 may be implemented in the same metal layer, similar to the implementation shown in FIG. 2B.

Figure 2D:
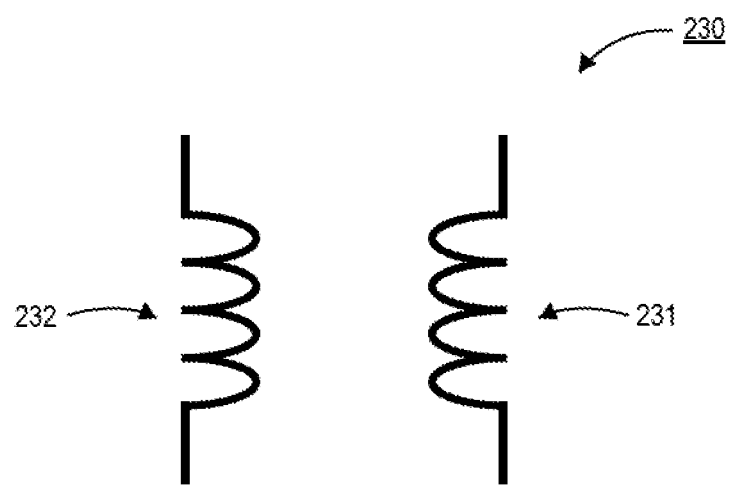
FIG. 2D is a schematic of a common mode choke filter that is implemented with only inductors, in accordance with an embodiment.

Referring now to FIG. 2D, a circuit diagram of an additional common mode choke filter 230 that may be implemented in a base die 103 is shown, in accordance with an embodiment. As shown, the common mode choke filter 230 comprises a first inductor 231 and a second inductor 232. The two inductors 231 and 232 are strongly coupled to each other. Accordingly, in some embodiments, the common mode choke filter 230 may omit capacitors.

Figure 2E:
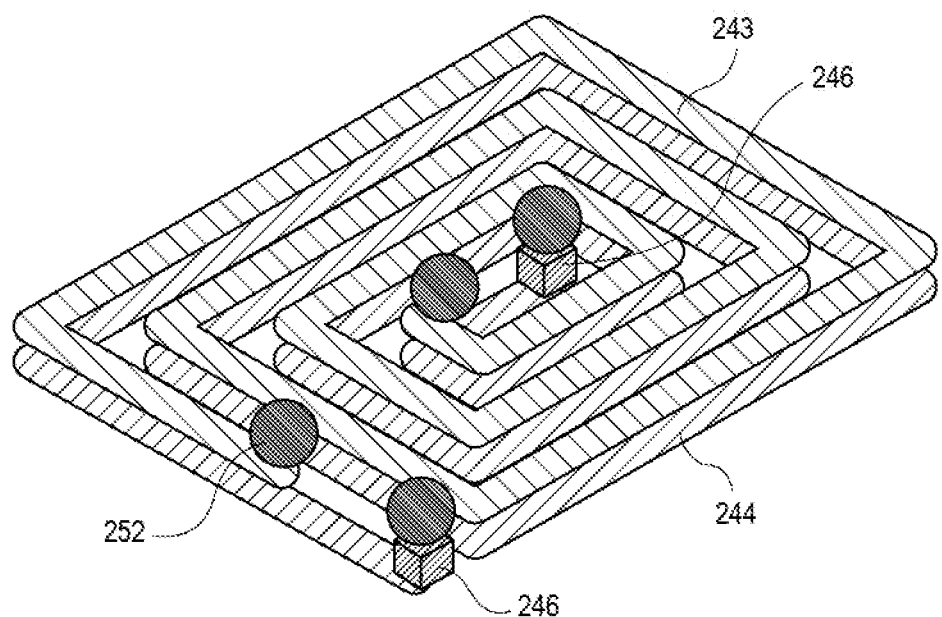
FIG. 2E is an illustration of the common mode choke filter in FIG. 2D implemented on a base die, in accordance with an embodiment.

Referring now to FIG. 2E, an illustration of an implementation of the common mode choke filter 230 in FIG. 2D is shown, in accordance with an embodiment. In the illustrated embodiment, only the components of the circuit are shown. That is, the layers of the base substrate 103 in which the common mode choke filter 230 are formed are omitted for clarity.

In an embodiment, the first inductor 231 is implemented as a first spiral trace 243 and the second inductor 232 is implemented as a second spiral trace 244. In an embodiment, the first spiral trace 243 may be in the second metal layer 112, and the second spiral trace 244 may be in the first metal layer 111. In other embodiments, the first spiral trace 243 and the second spiral trace 244 may be implemented in a single metal layer, similar to the embodiment shown in FIG. 2B. The first spiral trace 243 and the second spiral trace 244 may be electrically coupled to solder balls 252. The second spiral trace 244 may be electrically coupled to the solder balls 252 by vias 246 that pass through the second metal layer.

Figure 2F:
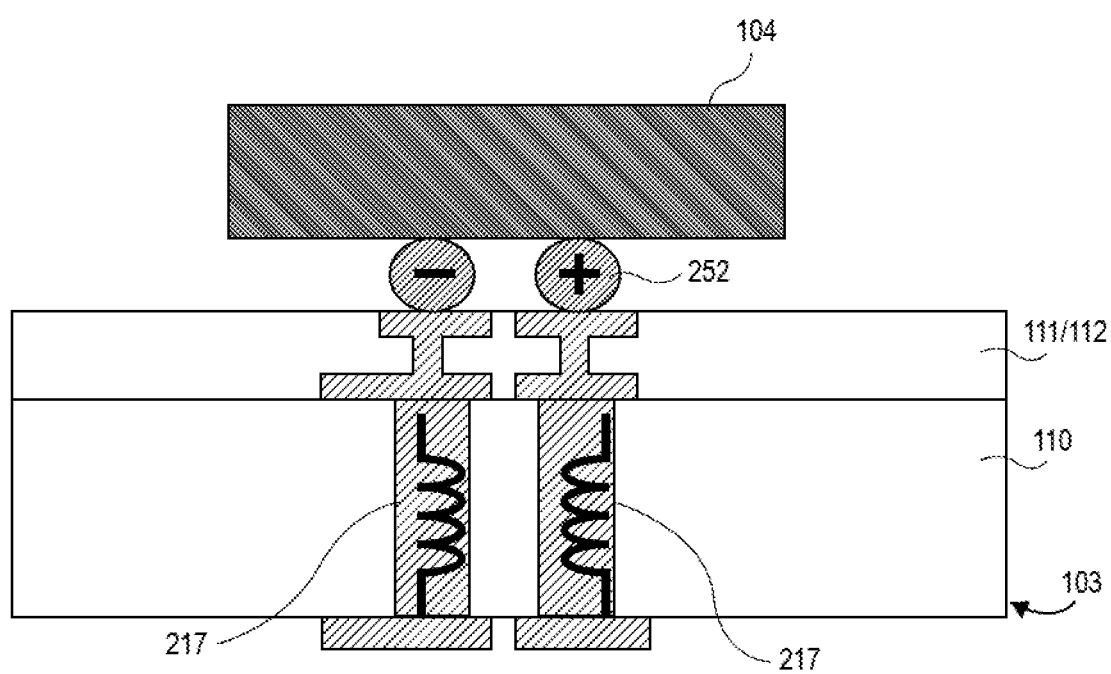
FIG. 2F is an illustration of the common mode choke filter in FIG. 2D implemented on a base die, in accordance with an additional embodiment.

Referring now to FIG. 2F, an illustration of an implementation of the common mode choke filter 230 in FIG. 2D is shown, in accordance with an additional embodiment. As shown, the first inductor 231 and the second inductor 232 may be implemented as TSVs 217 formed through the silicon substrate 110 of the base substrate 103. Pads and vias in the first metal layer and the second metal layer 111/112 may couple the TSVs 217 to solder balls 252. The solder balls 252 may be electrically coupled to the chiplet 104.

Figure 3A:
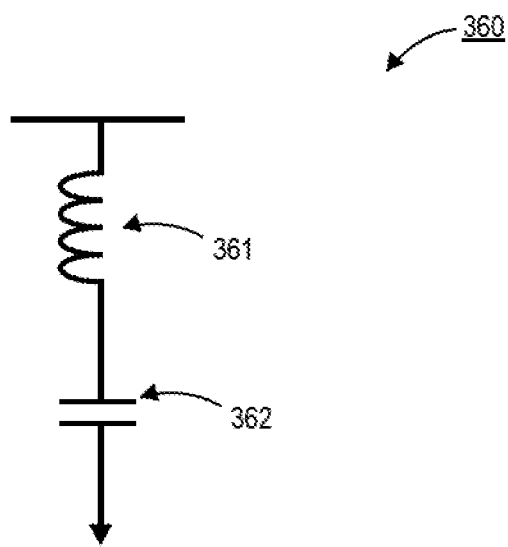
FIG. 3A is a schematic of a notch filter that may be implemented in a base die, in accordance with an embodiment.

Referring now to FIG. 3A, a circuit diagram of an alternative filter 360 that may be implemented in the base substrate 103 is shown, in accordance with an embodiment. In an embodiment, the filter 360 may be a notch filter. The notch filter may include an inductor 361 and a capacitor 362 that are in series with each other. The plate of the capacitor 362 opposite from the inductor 361 may be grounded or held at $V_{SS}$ potential.

Figure 3B:
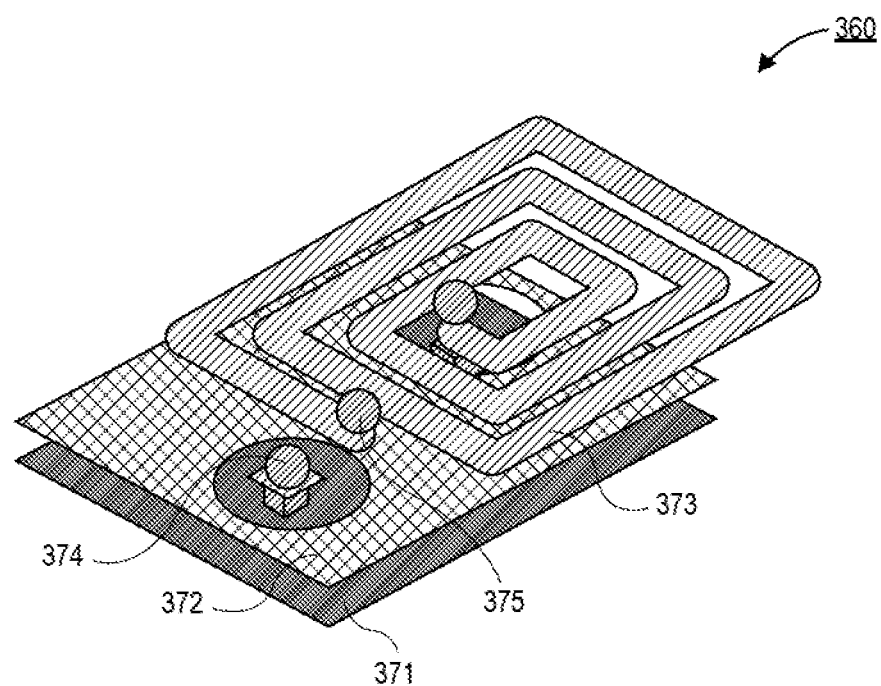
FIG. 3B is an illustration of the notch filter implemented in a base die, in accordance with an embodiment.

Referring now to FIG. 3B, an illustration of a notch filter 360 that is implemented in a base substrate 103 is shown, in accordance with an embodiment. In the illustrated embodiment, only the components of the circuit are shown. That is, the layers of the base substrate 103 in which the notch filter 360 are formed are omitted for clarity.

As shown, the filter 360 comprises a capacitor 362 that is implemented as a MIM capacitor. The MIM capacitor may have a pair of parallel plates 371 and 372. The parallel plates 371 and 372 may be disposed in a first metal layer (e.g., the first metal layer 111 in FIG. 1B). In an embodiment, an inductor 361 is disposed over the parallel plates 371 and 372. The inductor 361 may be implemented as a spiral trace 373. For example, the spiral trace 373 may be implemented in a second metal layer (e.g., the second metal layer 112 in FIG. 1B).

In an embodiment a first end of the spiral trace 373 may be connected to a chiplet (not shown) by a solder ball 375, and a second end of the spiral trace 373 may be connected to the plate 372 of the capacitor 362 by a via between the metal layers. In an embodiment, the other plate 371 may be connected to ground via a solder ball 374. The solder ball 374 may be connected to the plate 371 by a via that passes through an opening in the other plate 372. In the illustrated embodiment, the spiral trace 373 is positioned above the parallel plates 371 and 372. In other embodiments, the spiral trace 373 may be below the parallel plates 371.

Figure 3C:
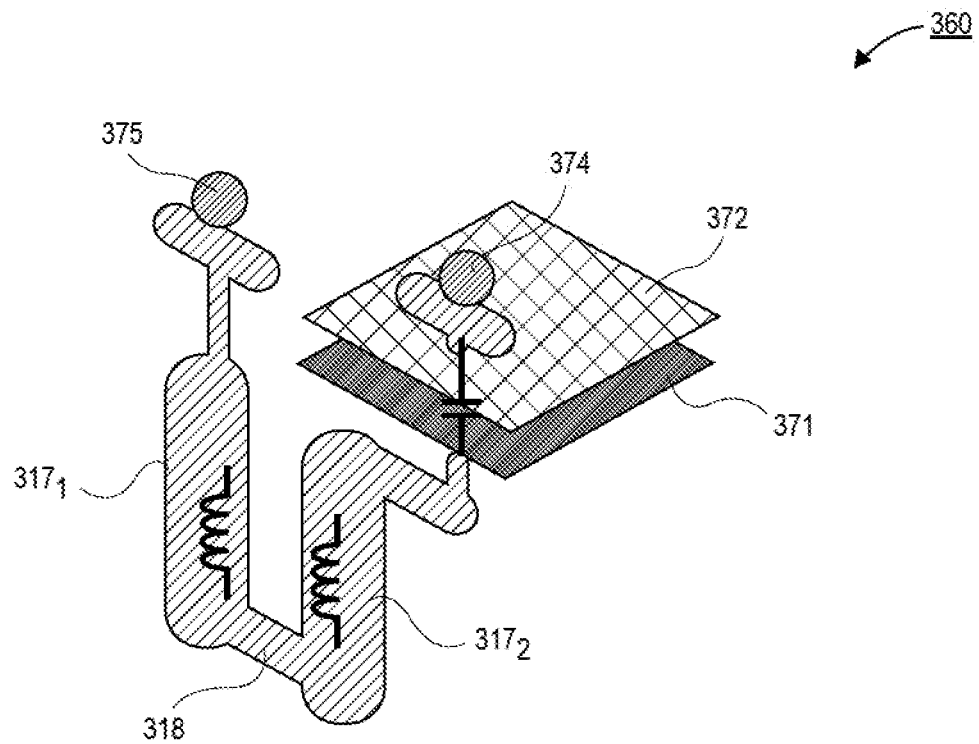
FIG. 3C is an illustration of the notch filter implemented in a base die, in accordance with an additional embodiment.

Referring now to FIG. 3C, an illustration of an implementation of a notch filter 360 is shown, in accordance with an additional embodiment. In the illustrated embodiment, only the components of the circuit are shown. That is, the layers of the base substrate 103 in which the notch filter 360 are formed are omitted for clarity.

In the notch filter 360, the inductor 361 is implemented as a pair of TSVs 317 that pass through the silicon substrate 110 of the base substrate 103. A first TSV $317_1$ is attached to a solder ball 375 by pads and vias through the metal layers over the silicon substrate 110, and the first TSV $317_1$ extends through the silicon substrate 110 to the backside surface of the base substrate 103. A trace 318 in a backside metal layer (e.g. the third metal layer 113 or the fourth metal layer 114 in FIG. 1B) connects the first TSV $317_1$ to a second TSV $317_2$. The second TSV $317_2$ passes up through the silicon substrate 110 back to the front side of the base substrate 103. The second TSV $317_2$ is connected to a plate 371 of the capacitor 362. The capacitor 362 (i.e., plates 371 and 372) may be disposed in the topside metal layers (e.g., between the first metal layer 111 or the second metal layer 112 in FIG. 1B). In an embodiment, the capacitor 362 may be a MIM capacitor. In an embodiment, solder ball 374 is attached to the plate 372 and is connected to ground.

Figure 3D:
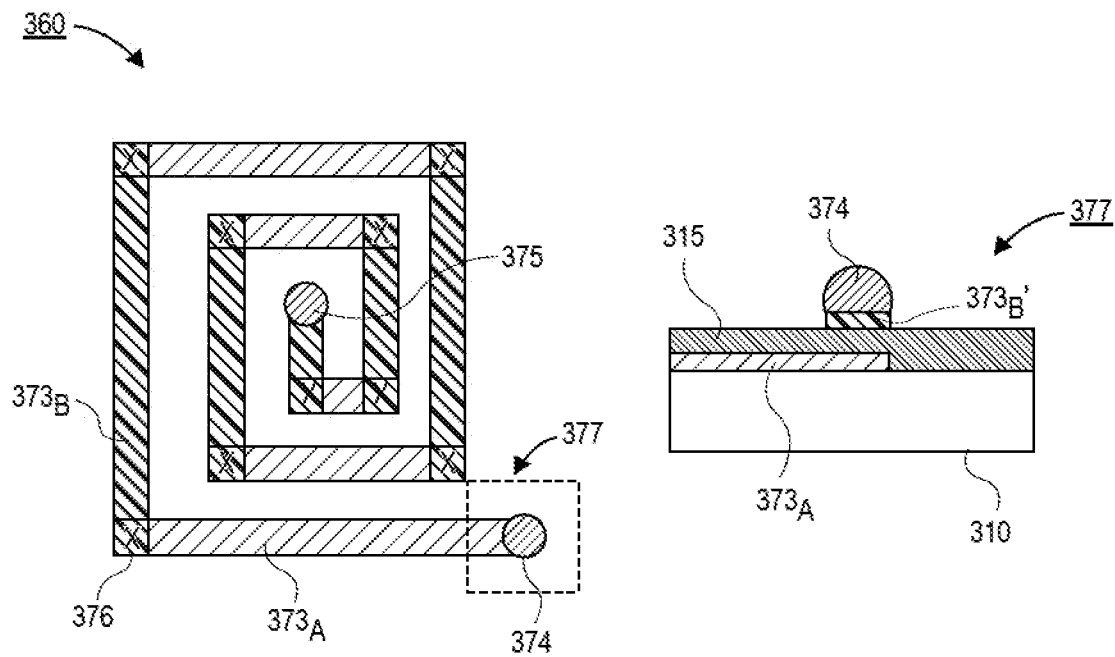
FIG. 3D is an illustration of the notch filter implemented in a base die, in accordance with an additional embodiment.

Referring now to FIG. 3D, a plan view illustration and a corresponding cross-sectional illustration of an implementation of a notch filter 360 is shown, in accordance with an additional embodiment. The cross-sectional illustration depicts the capacitor region 377 of the notch filter 360.

The inductor 361 is illustrated in the plan view. As shown, a composite spiral trace is provided. The composite spiral trace may comprise first portions $373_A$ that are connected to second portions $373_B$ by vias 376. The first portions $373_A$ may be provided in the first metal layer (e.g., the first metal layer 111 in FIG. 1B), and the second portions $373_B$ may be provided in the second metal layer (e.g., the second metal layer 112 in FIG. 1B). The first portions $373_A$ may extend in a first direction, and the second portions $373_B$ may extend in a second direction that is substantially orthogonal to the first direction. Such an embodiment is useful in architectures that do not allow 90° coplanar bends. In an embodiment, a first end of the composite spiral trace is connected to solder ball 375.

In the notch filter 360 of FIG. 3D, the capacitance is provided at region 377, as shown in the corresponding cross-sectional view of region 377. As shown in the cross-sectional view, a first portion $373_A$ of the composite spiral extends below a pad $373'_B$ over a substrate 310. The pad $373'_B$ may be in the same metal layer as the second portions $373_B$ of the composite spiral. However, the pad $373'_B$ is left floating and is connected to a bump 374. The bump 374 may be connected to ground. That is, a capacitance is provided across the insulating layer 315 between the pad $373'_B$ and the first portion $373_A$ of the composite spiral. Such an embodiment is useful when MIM capacitor architectures are not available for use in the base substrate 103.

Figure 3E:
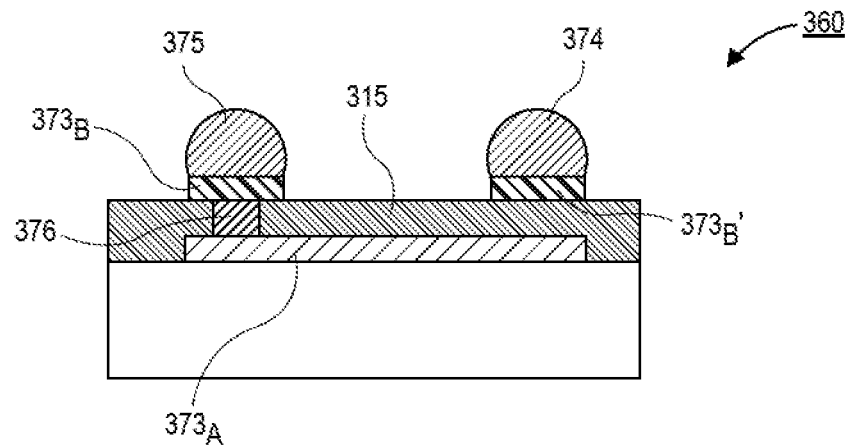
FIG. 3E is an illustration of the notch filter implemented in a base die, in accordance with an additional embodiment.

Referring now to FIG. 3E, a cross-sectional illustration of an implementation of a notch filter 360 is shown, in accordance with an additional embodiment. The notch filter 360 may comprise an inductor 361 that is implemented as a trace 373$_A$ and a capacitor that is implemented by a floating pad 373'$_B$ and the trace 373$_A$. In an embodiment, a first end of the trace 373$_A$ is connected to a bump 375 by a via 376 and a pad 373$_B$. A second end of the trace 373$_A$ forms the bottom plate of the capacitor 362, and the floating pad 373'$_B$ forms the second plate of the capacitor 362. The floating pad 373'$_B$ may be contacted by a bump 374 that is connected to ground.

In the embodiments described above, filtering architectures were disclosed in order to limit RF interference. However, embodiments are not limited to filtering architectures. Additional embodiments may include RF shielding architectures. For example, Faraday's cages may be implemented in the electronic system 100 in order to minimize RF interference between components or between neighboring systems.

Figure 4A:
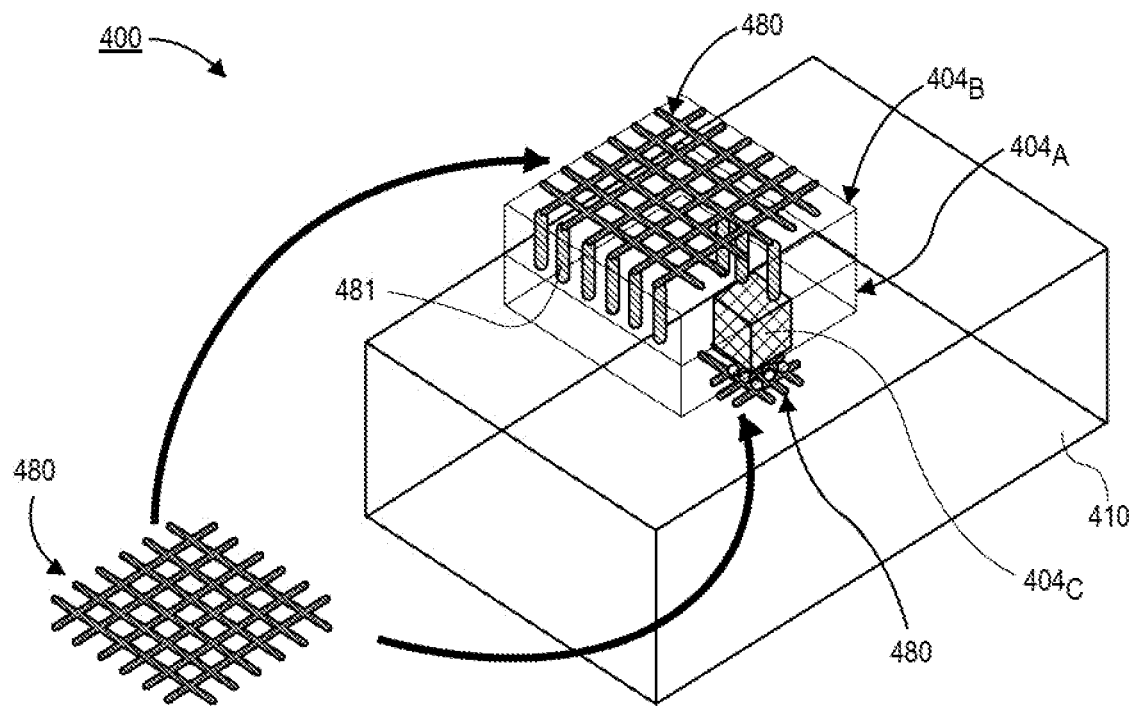
FIG. 4A is an illustration of a chiplet on a base die with a conductive mesh above and below the chiplet, in accordance with an embodiment.

Referring now to FIG. 4A, an illustration of a portion of a system 400 that comprises a chiplet 404 over a base substrate 410 is shown, in accordance with an embodiment. The chiplet 404 may comprise an active layer 404$_A$ and a bulk layer 404$_B$. The active layer 404$_A$ may house the active circuitry of the chiplet 404. Particularly, a portion of the active layer 404$_A$ may comprise a high RF noise generation region 404$_C$. In order to block the RF noise from propagating to other components a conductive mesh 480 may be provided. In an embodiment, the conductive mesh 480 may be grounded.

As shown, the conductive mesh 480 may comprise conductive traces that are laid out in a grid-like pattern. The conductive mesh 480 provides an RF shield to prevent the spread of RF noise. In an embodiment, the conductive mesh 480 may be disposed over a backside of the chiplet 404. For example, a conductive mesh 480 is provided over the bulk layer 404$_B$. Such a conductive mesh 480 may reduce the RF noise that is coupled into a thermal solution. In an embodiment, the conductive mesh 480 may be further augmented by TSVs 481 through the bulk layer 404$_B$ around a perimeter of the chiplet 404. In an embodiment, the conductive mesh 480 may be floating. In other embodiments, the conductive mesh 480 may be grounded.

In an embodiment, a conductive mesh 480 may also be located proximate to the region 404$_C$. As such, localized shielding may be provided below regions known to generate high RF noise in order to prevent the RF noise from propagating into the base substrate 410. In an embodiment, the conductive mesh 480 may be implemented in one or more of the metal layers of the base substrate 410 (e.g. the first metal layer 111 or the second metal layer 112 in FIG. 1B). In an embodiment, the conductive mesh 480 may be floating or grounded.

Electronic systems similar to those described with respect to FIG. 1A also include high speed I/O (HSIO) connections between the chiplets 104. In some embodiments, the HSIOs may operate in the 1-10 GHz range. As such, the HSIOs may be a significant source of RF noise. Accordingly, embodiments disclosed herein may include a Faraday's cage that surrounds the HSIOs between chiplets 404. An example of such an embodiment is shown in FIG. 4B.

Figure 4B:
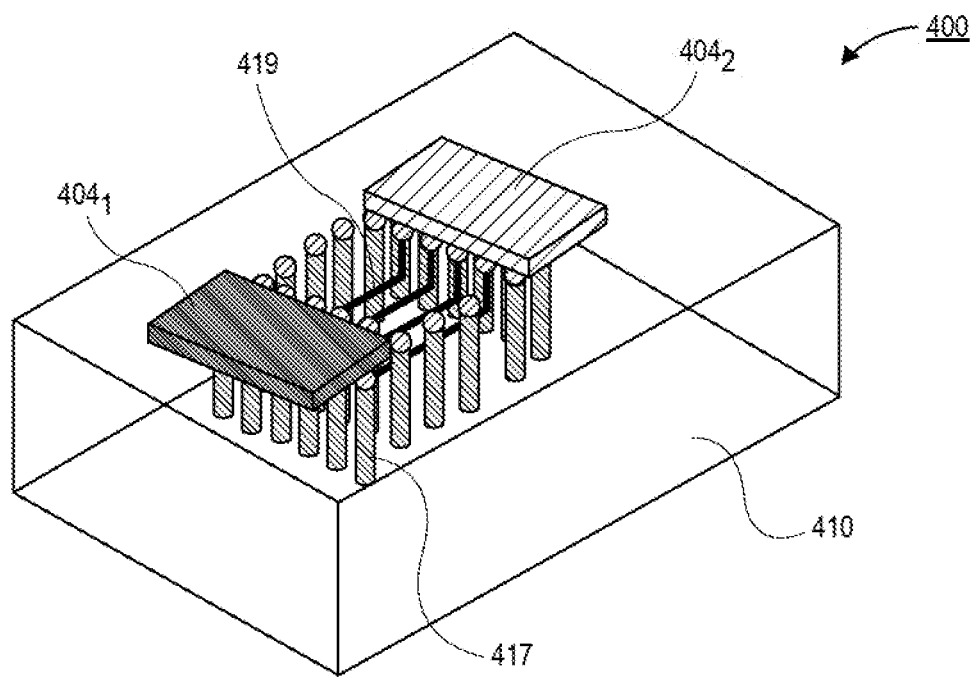
FIG. 4B is an illustration of a pair of chiplets that are communicatively coupled through the base die, with a Faraday's cage around the interconnects, in accordance with an embodiment.

FIG. 4B illustrates a first chiplet 404$_1$ that is communicatively coupled to a second chiplet 404$_2$ by a plurality of HSIOs 419. The HSIOs 419 are implemented on the base substrate 410. For example, the HSIOs 419 may be implemented in the first or second metal layers. In an embodiment, a Faraday's cage is provided around the HSIOs 419. The Faraday's cage may comprise a plurality of TSVs 417 that pass through the base substrate 410. As such, the RF noise from the HSIOs 419 may be shielded from propagation away from the chiplets 404$_1$ and 404$_2$.

Figure 4C:
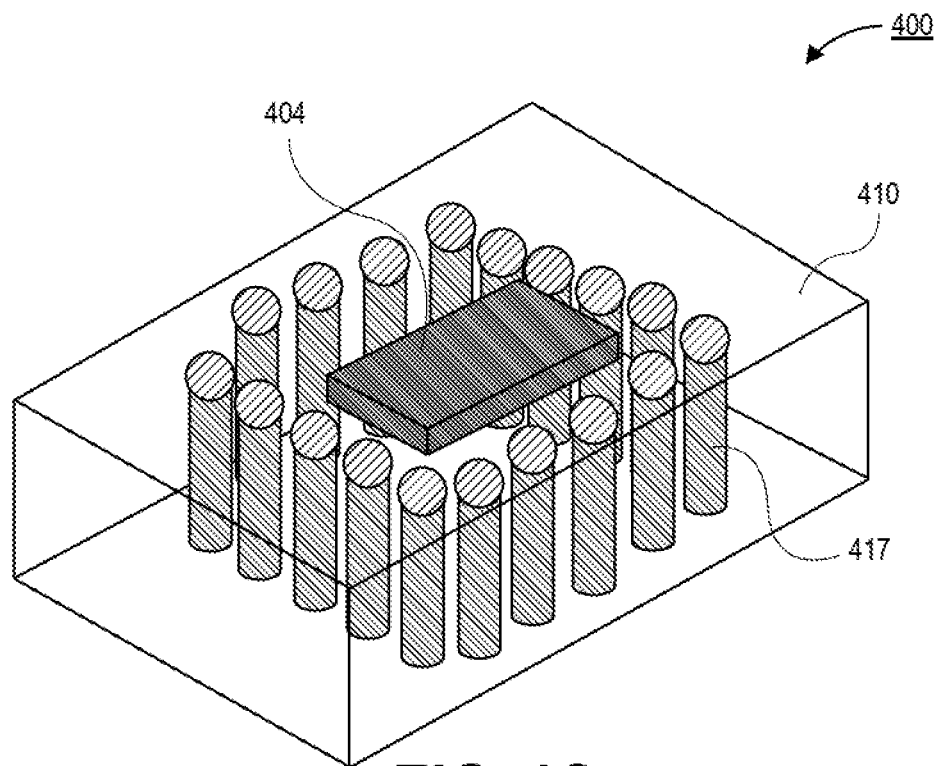
FIG. 4C is an illustration of a chiplet surrounded by a Faraday's cage, in accordance with an embodiment.

Similar Faraday's cages may also be used to isolate individual chiplets 404. Such an embodiment is shown in FIG. 4C. As shown, a chiplet 404 may be disposed over the base substrate 410. In order to isolate the chiplet 404, a plurality of TSVs 417 may surround a perimeter of the chiplet 404. In the illustrated embodiment, a single chiplet 404 is within the ring of TSVs 417. However, in other embodiments, two or more chiplets 404 may be surrounded by a ring of TSVs 417.

Figure 5:
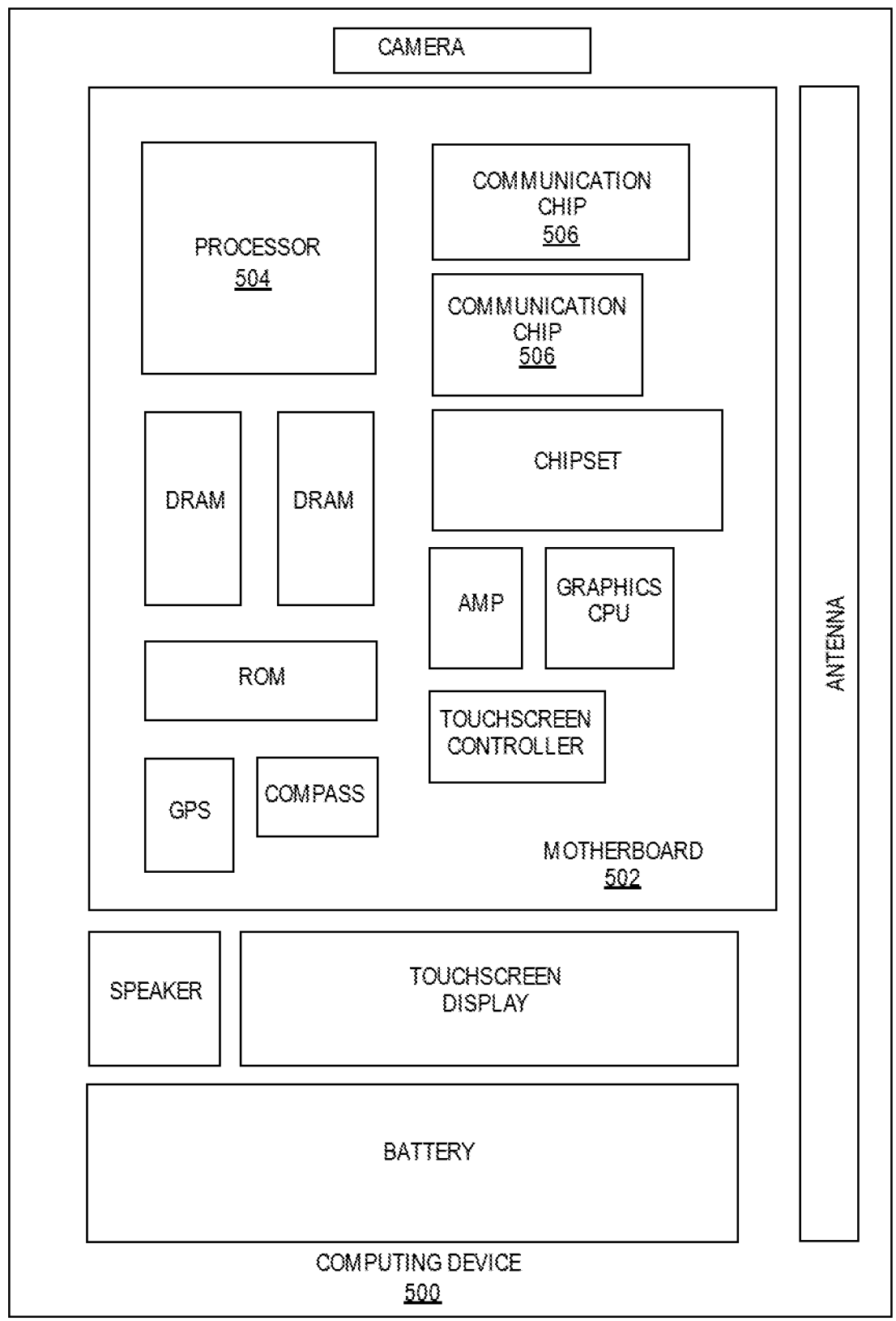
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor 504 may be part of an electronic package that comprises a plurality of dies attached to a base die, where the base die comprises one or more filtering architectures, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip 506 may be part of an electronic package that comprises a plurality of dies attached to a base die, where the base die comprises one or more filtering architectures, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a base die over the package substrate; and a plurality of chiplets over the base die, wherein the base die comprises: a substrate; a first metal layer and a second metal layer between the substrate and the plurality of chiplets; a third metal layer and a fourth metal layer between the package substrate and the substrate; and a filter integrated into one or more layers of the base die.

Example 2: the electronic package of Example 1, wherein the filter is a common mode choke.

Example 3: the electronic package of Example 2, wherein the common mode choke comprises: a first capacitor having a first plate and a second plate; a second capacitor having a third plate and a fourth plate; a first spiral trace connected between the first plate and the third plate; a second spiral trace connected between the second plate and the fourth plate.

Example 4: the electronic package of Example 3, wherein the first capacitor and the second capacitor are between the first metal layer and the second metal layer, and wherein the first spiral trace and the second spiral trace are in the second metal layer.

Example 5: the electronic package of Example 3, wherein the first capacitor and the second capacitor are between the first metal layer and the second metal layer, wherein the first spiral trace is in the third metal layer, and wherein the second spiral trace is in the fourth metal layer.

Example 6: the electronic package of Example 5, wherein through substrate vias connect the first spiral trace and the second spiral trace to the first capacitor and the second capacitor.

Example 7: the electronic package of Example 2, wherein the common mode choke comprises a first inductor and a second inductor.

Example 8: the electronic package of Example 7, wherein the first inductor comprises a spiral trace in the first metal layer, and wherein the second inductor comprises a spiral trace in the second metal layer.

Example 9: the electronic package of Example 7, wherein the first inductor comprises a first through substrate via, and wherein the second inductor comprises a second through substrate via.

Example 10: the electronic package of Example 1, wherein the filter comprises a notch filter with an inductor and a capacitor connected in series.

Example 11: the electronic package of Example 10, wherein the inductor comprises a spiral trace in the first metal layer, and wherein the capacitor comprises parallel plates between the first metal layer and the second metal layer.

Example 12: the electronic package of Example 10, wherein the inductor comprises a pair of through silicon vias connected together by a trace in the third metal layer, and wherein the capacitor comprises parallel plates between the first metal layer and the second metal layer.

Example 13: the electronic package of Example 10, wherein the inductor comprises a conductive spiral disposed in both the first metal layer and the second metal layer, and wherein the capacitor comprises a floating pad in the second metal layer.

Example 14: the electronic package of Example 10, wherein the inductor comprises a trace in the first metal layer, and wherein the capacitor comprises a floating pad in the second metal layer.

Example 15: an electronic package comprising: a package substrate; a base substrate over the package substrate; a plurality of chiplets over the substrate; and a Faraday's cage around at least one of the plurality of chiplets.

Example 16: the electronic package of Example 15, wherein the Faraday's cage comprises: a conductive mesh over a backside surface of the at least one of the plurality of chiplets, wherein the conductive mesh is grounded.

Example 17: the electronic package of Example 15 or Example 16, wherein the Faraday's cage comprises a conductive mesh in a metal layer of the base substrate over a front side surface of the at least one of the plurality of chiplets.

Example 18: the electronic package of Examples 15-17, wherein the Faraday's cage comprises through substrate vias in the base substrate.

Example 19: the electronic package of Example 18, wherein the through substrate vias surround an interconnect in the base substrate between a first chiplet and a second chiplet.

Example 20: the electronic package of Example 18, wherein the through substrate vias surround a perimeter of the at least one of the plurality of chiplets.

Example 21: a silicon substrate, comprising: a substrate; a first metal layer and a second metal layer over the substrate; a third metal layer and a fourth metal layer under the substrate and the substrate; and a filter integrated into one or more layers of the silicon substrate, wherein the filter is a common mode choke or a notch filter.

Example 22: the silicon substrate of Example 21, wherein the filter comprises: a first capacitor; a second capacitor; a first spiral trace connected between the first capacitor and the second capacitor; a second spiral trace connected between the first capacitor and the second capacitor.

Example 23: the silicon substrate of Example 21, wherein the filter comprises: an inductor and a capacitor connected in series, wherein the inductor comprises a spiral trace in the first metal layer, and wherein the capacitor comprises parallel plates in the second metal layer.

Example 24: an electronic system, comprising: a board; a base die coupled to the board; and a plurality of chiplets over the base die, wherein the base die comprises: a substrate; a first metal layer and a second metal layer between the substrate and the plurality of chiplets; a third metal layer and a fourth metal layer between the package substrate and the substrate; and a filter integrated into one or more layers of the base die.

Example 25: the electronic system of Example 24, wherein the filter is a common mode choke or a notch filter.

What is claimed is:

1. An electronic package, comprising:
   a package substrate;
   a base die over the package substrate; and
   a plurality of chiplets over the base die, wherein the base die comprises:
   a substrate;
   a first metal layer and a second metal layer between the substrate and the plurality of chiplets;
   a third metal layer and a fourth metal layer between the package substrate and the substrate, the third metal layer vertically spaced apart from the fourth metal layer; and
   a filter integrated into one or more layers of the base die.

2. The electronic package of claim 1, wherein the filter is a common mode choke.

3. The electronic package of claim 2, wherein the common mode choke comprises:
   a first capacitor having a first plate and a second plate;
   a second capacitor having a third plate and a fourth plate;
   a first spiral trace connected between the first plate and the third plate;
   a second spiral trace connected between the second plate and the fourth plate.

4. The electronic package of claim 3, wherein the first capacitor and the second capacitor are between the first metal layer and the second metal layer, and wherein the first spiral trace and the second spiral trace are in the second metal layer.

5. The electronic package of claim 3, wherein the first capacitor and the second capacitor are between the first metal layer and the second metal layer, wherein the first spiral trace is in the third metal layer, and wherein the second spiral trace is in the fourth metal layer.

6. The electronic package of claim 5, wherein through substrate vias connect the first spiral trace and the second spiral trace to the first capacitor and the second capacitor.

7. The electronic package of claim 2, wherein the common mode choke comprises a first inductor and a second inductor.

8. The electronic package of claim 7, wherein the first inductor comprises a spiral trace in the first metal layer, and wherein the second inductor comprises a spiral trace in the second metal layer.

9. The electronic package of claim 7, wherein the first inductor comprises a first through substrate via, and wherein the second inductor comprises a second through substrate via.

10. The electronic package of claim 1, wherein the filter comprises a notch filter with an inductor and a capacitor connected in series.

11. The electronic package of claim 10, wherein the inductor comprises a spiral trace in the first metal layer, and wherein the capacitor comprises parallel plates between the first metal layer and the second metal layer.

12. The electronic package of claim 10, wherein the inductor comprises a pair of through silicon vias connected together by a trace in the third metal layer, and wherein the capacitor comprises parallel plates between the first metal layer and the second metal layer.

13. The electronic package of claim 10, wherein the inductor comprises a conductive spiral disposed in both the first metal layer and the second metal layer, and wherein the capacitor comprises a floating pad in the second metal layer.

14. The electronic package of claim 10, wherein the inductor comprises a trace in the first metal layer, and wherein the capacitor comprises a floating pad in the second metal layer.

15. An electronic package, comprising:
    a package substrate;
    a base die over the package substrate; and
    a plurality of chiplets over the base die, wherein the base die comprises:
    a substrate;
    a first metal layer and a second metal layer between the substrate and the plurality of chiplets;
    a third metal layer and a fourth metal layer between the package substrate and the substrate; and
    a filter integrated into one or more layers of the base die, wherein the filter is a common mode choke, and wherein the common mode choke comprises:
    a first capacitor having a first plate and a second plate;
    a second capacitor having a third plate and a fourth plate;
    a first spiral trace connected between the first plate and the third plate; and
    a second spiral trace connected between the second plate and the fourth plate.

16. The electronic package of claim 15, wherein the first capacitor and the second capacitor are between the first metal layer and the second metal layer, and wherein the first spiral trace and the second spiral trace are in the second metal layer.

17. The electronic package of claim 15, wherein the first capacitor and the second capacitor are between the first metal layer and the second metal layer, wherein the first spiral trace is in the third metal layer, and wherein the second spiral trace is in the fourth metal layer.

18. The electronic package of claim 17, wherein through substrate vias connect the first spiral trace and the second spiral trace to the first capacitor and the second capacitor.

19. An electronic package, comprising:
    a package substrate;
    a base die over the package substrate; and
    a plurality of chiplets over the base die, wherein the base die comprises:
    a substrate;
    a first metal layer and a second metal layer between the substrate and the plurality of chiplets;
    a third metal layer and a fourth metal layer between the package substrate and the substrate; and
    a filter integrated into one or more layers of the base die, wherein the filter is a common mode choke, wherein the common mode choke comprises a first inductor and a second inductor, and wherein:
    the first inductor comprises a spiral trace in the first metal layer, and the second inductor comprises a spiral trace in the second metal layer; or the first inductor comprises a first through substrate via, and wherein the second inductor comprises a second through substrate via.

20. The electronic package of claim 19, wherein the first inductor comprises the spiral trace in the first metal layer, and wherein the second inductor comprises the spiral trace in the second metal layer.

21. The electronic package of claim 19, wherein the first inductor comprises the first through substrate via, and wherein the second inductor comprises the second through substrate via.

22. An electronic package, comprising:
a package substrate;
a base die over the package substrate; and
a plurality of chiplets over the base die, wherein the base die comprises:
  a substrate;
  a first metal layer and a second metal layer between the substrate and the plurality of chiplets;
  a third metal layer and a fourth metal layer between the package substrate and the substrate; and
  a filter integrated into one or more layers of the base die, wherein the filter comprises a notch filter with an inductor and a capacitor connected in series, and wherein:
the inductor comprises a spiral trace in the first metal layer, and wherein the capacitor comprises parallel plates between the first metal layer and the second metal layer; or
the inductor comprises a pair of through silicon vias connected together by a trace in the third metal layer, and wherein the capacitor comprises parallel plates between the first metal layer and the second metal layer; or
the inductor comprises a conductive spiral disposed in both the first metal layer and the second metal layer, and wherein the capacitor comprises a floating pad in the second metal layer; or
the inductor comprises a trace in the first metal layer, and wherein the capacitor comprises a floating pad in the second metal layer.

23. The electronic package of claim 22, wherein the inductor comprises the spiral trace in the first metal layer, and wherein the capacitor comprises the parallel plates between the first metal layer and the second metal layer.

24. The electronic package of claim 22, wherein the inductor comprises the pair of through silicon vias connected together by the trace in the third metal layer, and wherein the capacitor comprises the parallel plates between the first metal layer and the second metal layer.

25. The electronic package of claim 22, wherein the inductor comprises the conductive spiral disposed in both the first metal layer and the second metal layer, and wherein the capacitor comprises the floating pad in the second metal layer.

26. The electronic package of claim 22, wherein the inductor comprises the trace in the first metal layer, and wherein the capacitor comprises the floating pad in the second metal layer.

* * * * *